US007170798B2

(12) United States Patent
Poechmueller

(10) Patent No.: US 7,170,798 B2
(45) Date of Patent: Jan. 30, 2007

(54) CONTROLLED SUBSTRATE VOLTAGE FOR MEMORY SWITCHES

(75) Inventor: Peter Poechmueller, Unterhaching (DE)

(73) Assignee: Infineon Technologies AG, Munich (DE)

( * ) Notice: Subject to any disclaimer, the term of this patent is extended or adjusted under 35 U.S.C. 154(b) by 488 days.

(21) Appl. No.: 10/652,266

(22) Filed: Aug. 29, 2003

(65) Prior Publication Data

US 2005/0050262 A1 Mar. 3, 2005

(51) Int. Cl.
*G11C 16/04* (2006.01)

(52) U.S. Cl. ........................... 365/189.09; 365/230.06; 365/148

(58) Field of Classification Search ........... 365/189.09, 365/230.08, 148
See application file for complete search history.

(56) References Cited

U.S. PATENT DOCUMENTS 4,799,193 A 1/1989 Horiguchi et al.
5,321,647 A 6/1994 Bronner et al.
5,604,707 A 2/1997 Kuge et al.
6,232,793 B1 5/2001 Arimoto et al.
6,563,746 B2 * 5/2003 Fujioka et al. ......... 365/189.09

FOREIGN PATENT DOCUMENTS

EP 0 568 818 A2 11/1993

* cited by examiner

*Primary Examiner*—David Lam
(74) *Attorney, Agent, or Firm*—Slater & Matsil, L.L.P.

(57) ABSTRACT

Active control of body contacts in memory devices can provide variable substrate voltages during device operation. The body contacts can be used to adjust the body bias of switches in activated memory cells, while maintaining the body bias of switches in inactive memory cells. This can reduce the body effect (i.e., variation of the threshold voltage due to a variation of the substrate or bulk voltage) and can therefore provide improved array device performance (e.g., reduced data corruption) while the word line ("WL") is activated.

21 Claims, 2 Drawing Sheets

VPP
110
120
133
135
130
137
-0.5V
143
145
140
147
-0.5V
100

VPP
110
120
133
135
130
137
143
145
140
147
200
215
217
210
220
213
230
-0.5V

CONTROLLED SUBSTRATE VOLTAGE FOR MEMORY SWITCHES

FIELD OF THE INVENTION

The invention relates generally to semiconductor memory integrated circuits ("ICs"), such as dynamic random access memories ("DRAMs"), and, more particularly, to a controlled substrate voltage for such ICs.

BACKGROUND OF THE INVENTION

Dynamic random access memories ("DRAMs") are the most commonly manufactured product of all semiconductor integrated circuits ("ICs"). DRAMs are data storage devices that store data as a charge on a storage capacitor. A DRAM typically includes an array of memory cells. Each memory cell includes a storage capacitor and a transistor for transferring charges to and from the storage capacitor. Each memory cell is addressed by a word line ("WL") and accessed by a bit line ("BL") pair. The WL controls the transistor such that the transistor couples the storage capacitor to and decouples the storage capacitor from the BL pair for writing data to and reading data from the memory cell. Multiple word lines correspond to multiple rows of memory cells, while multiple bit line pairs correspond to multiple columns of memory cells.

DRAM array devices should be designed with minimum leakage currents so as to be capable of supporting as high as possible retention times. Therefore, the substrate voltage is conventionally connected to negative voltage levels, such as −0.5 V, to reduce leakage currents. However, this can result in increased source to substrate voltages, thereby increasing the threshold voltage and reducing device performance (e.g., reduced write back current). Additionally, DRAM devices may not share a common substrate, but may have individual substrate wells. Examples of such DRAM devices include silicon on insulator ("SOI") DRAMs and vertical (e.g., trench technology) DRAM devices with complete body pinch off due to the buried strap ("BS") beyond the cell dimensions. The BS provides the outdiffusion from the trench to the drain of the array device, thereby providing connection. Since the BS diffuses horizontally, it can eventually connect to the next trench, isolating the well.

It is therefore desirable to provide a solution that can reduce the increase in the array device threshold voltage. Exemplary embodiments of the invention actively adjust the substrate well voltage during operation of the memory device. This can reduce the body effect (i.e., variation of the threshold voltage due to a variation of the substrate or bulk voltage) and can therefore provide improved array device performance (e.g., reduced data corruption) while the word line ("WL") is activated.

BRIEF DESCRIPTION OF THE DRAWINGS

The above and further advantages of the invention may be better understood by referring to the following description in conjunction with the accompanying drawings in which corresponding numerals in the different figures refer to the corresponding parts, in which.

DETAILED DESCRIPTION

While the making and using of various embodiments of the present invention are discussed herein in terms of specific sensing schemes and voltage conditions, it should be appreciated that the present invention provides many inventive concepts that can be embodied in a wide variety of contexts. The specific embodiments discussed herein are merely illustrative of specific ways to make and use the invention, and are not meant to limit the scope of the invention.

The present invention provides a solution that can reduce the increase in the threshold voltage of dynamic random access memory ("DRAM") devices, thereby improving device performance during operation. The use of body contacts as described herein can provide variable substrate voltages during DRAM operation. The body contacts can change the body bias of activated memory cells, while maintaining the body bias of inactive memory cells. This can reduce the body effect (i.e., variation of the threshold voltage due to a variation of the substrate or bulk voltage) and can therefore provide improved array device performance (e.g., reduced data corruption) while the word line ("WL") is activated.

Figure 1:
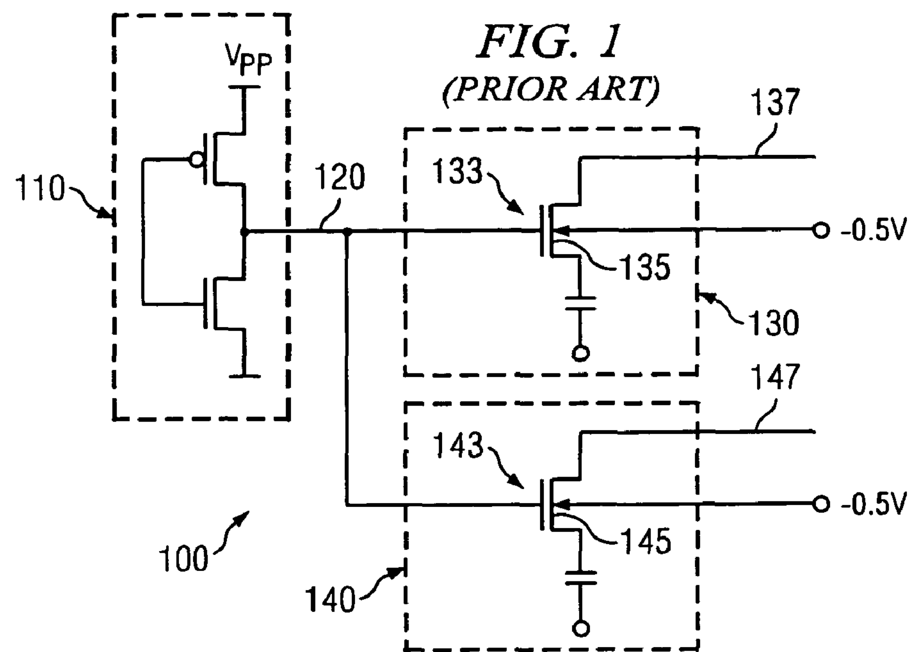
FIG. 1 diagrammatically illustrates a DRAM circuit implementation in accordance with the known art.

FIG. 1 diagrammatically illustrates a DRAM circuit implementation 100 in accordance with the known art. Word line driver final stage 110 drives WL 120 which is connected to memory cells 130 and 140. Values are read out of memory cells 130 and 140 on bitlines ("BL") 137 and 147, respectively. Memory cells 130 and 140 include transistor switches 133 and 143, respectively. Substrate wells 135 and 145 of transistors 133 and 143, respectively, are each connected to a fixed potential of −0.5 volts.

Figure 2:
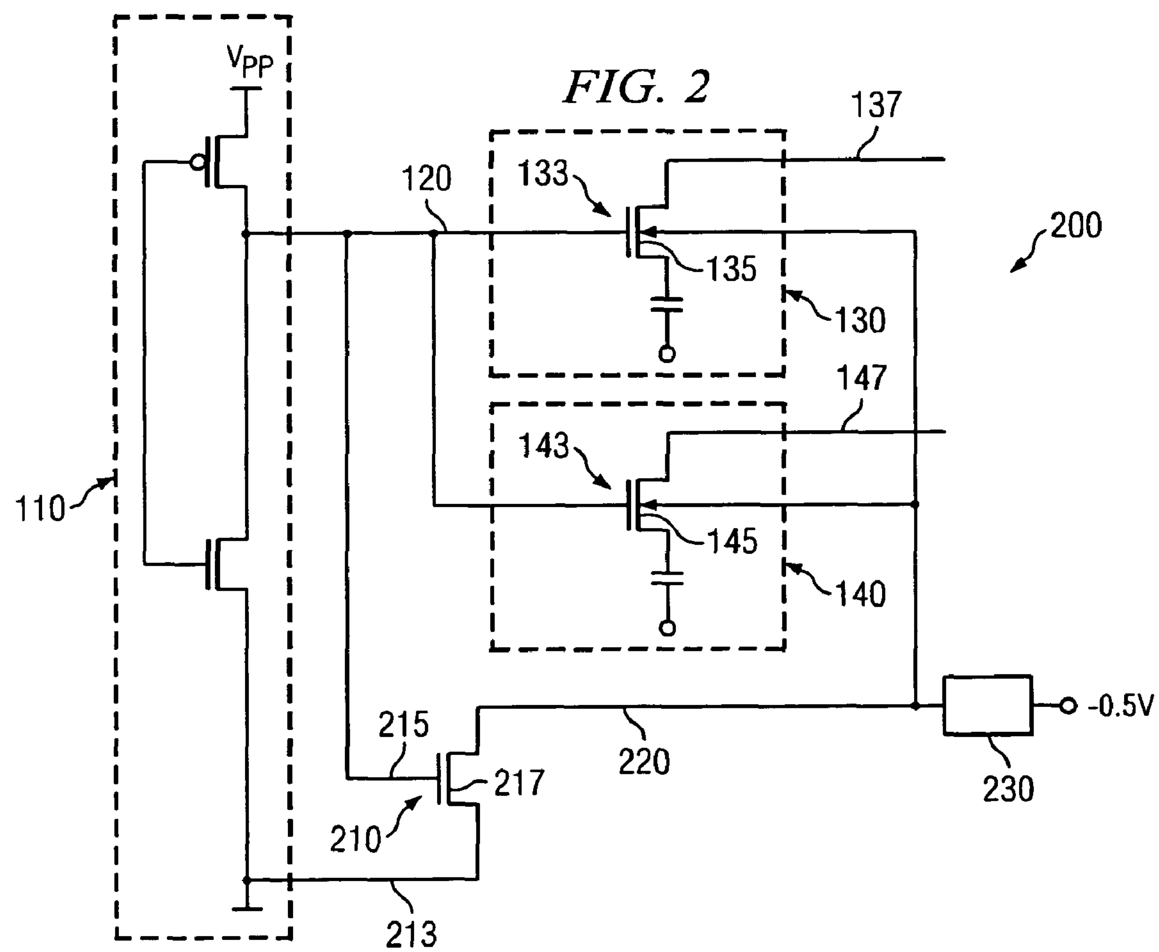
FIG. 2 diagrammatically illustrates exemplary embodiments of a DRAM circuit implementation in accordance with the present invention.

Exemplary embodiments of the present invention can modify circuit implementation 100 to include transistor 210, body contact 220, and resistor 230, as illustrated by the circuit implementation 200 shown in FIG. 2. Source 213 and gate 215 of transistor 210 can be connected to final stage 110 and WL 120, respectively. Drain 217 of transistor 210 can connect to resistor 230 through body contact 220. Transistor 210 is coupled to body contact 220 which is connected to substrate wells 135 and 145 of memory cells 130 and 140. In some exemplary embodiments, a body contact, such as 220, can be connected to the substrate wells of all array devices connected to a word line, such as WL 120. In the exemplary embodiment illustrated in FIG. 2, if WL 120 is inactive, body contact 220 will be connected to a fixed potential of −0.5 volts via resistor 230. Once WL 120 is activated, the potential at body contact 220 will be adjusted to 0 volts as long as the on-resistance of transistor switch 210 is considerably lower (e.g., 5–10 times lower) than the resistance of resistor 230. This can result in reduced body effect and improved array device performance while WL 120 is activated.

Figure 3:
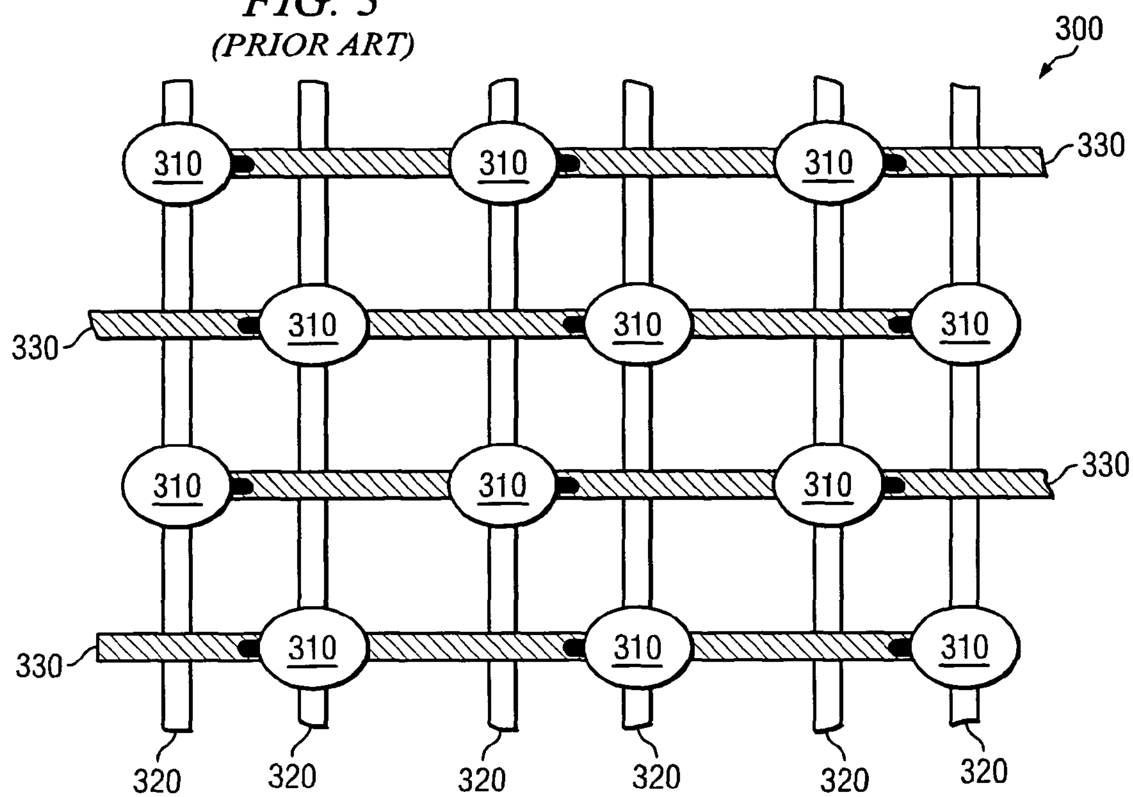
FIG. 3 diagrammatically illustrates a vertical cell layout in accordance with the known art.

FIG. 3 diagrammatically illustrates a vertical cell layout 300 in accordance with the known art. Trench memory cells 310 each have a single buried strap (shown in black). Cells 310 are addressed by their respective WL 320 and have respective non-isolated (i.e., connected to a wafer substrate) substrate wells 330.

Figure 4:
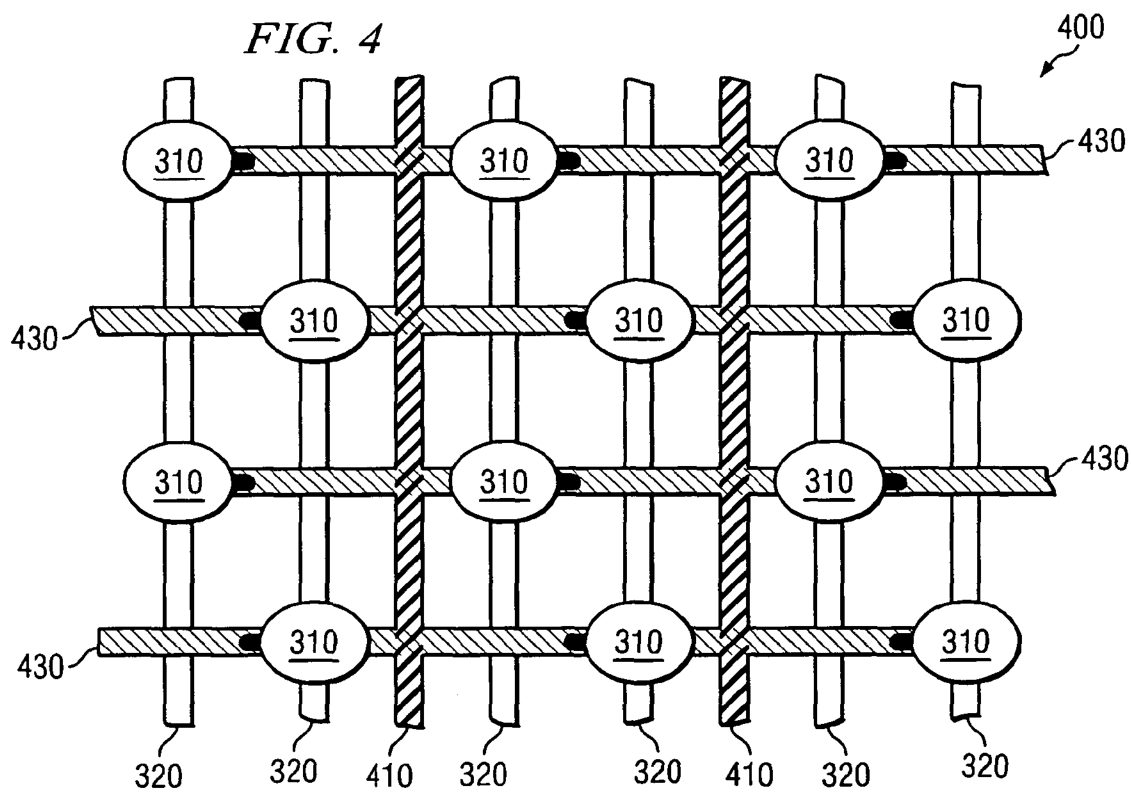
FIG. 4 diagrammatically illustrates exemplary embodiments of a vertical cell layout including body contacts in accordance with the present invention.

Exemplary embodiments of the present invention can provide body contact rows 410, as illustrated by the exemplary vertical cell layout 400 of FIG. 4. Each body contact row 410 can, in some embodiments, correspond to a respective body contact 220 (see also FIG. 2), thereby to ensure a defined voltage level at substrate wells 430 as described above.

Although exemplary embodiments of the present invention have been described in detail, it will be understood by workers in the art that various modifications can be made therein without departing from the spirit and scope of the invention as set forth in the appended claims.

What is claimed is:

1. A DRAM apparatus, comprising:

a storage cell including a transistor having a substrate well; and a voltage adjuster coupled to said substrate well for adjusting a voltage on said substrate well; and a word line driver final stage coupled to said transistor of said storage cell via a word line for accessing said storage cell;

wherein said voltage adjuster is coupled to said word line and is responsive to activation of said word line by said word line driver final stage for adjusting the voltage on said substrate well.

2. The apparatus of claim 1, wherein said voltage adjuster includes a switch coupled to said input and said substrate well, said switch responsive to activation of said input for initiating adjustment of the voltage on said substrate well.

3. The apparatus of claim 2, wherein said voltage adjuster includes a node at a predetermined voltage coupled to said switch.

4. The apparatus of claim 3, wherein said node is coupled to said substrate well.

5. The apparatus of claim 3, wherein said voltage adjuster includes a resistor connected in series between said switch and said node.

6. The apparatus of claim 5, wherein said switch includes a transistor, said transistor having a gate coupled to said input, a drain coupled to said resistor and said substrate well, and a source coupled to a voltage source.

7. The apparatus of claim 3, wherein said voltage adjuster includes a further node at a further predetermined voltage coupled to said switch.

8. The apparatus of claim 7, wherein said voltage adjuster includes a resistor connected in series between said first-mentioned node and said switch, said switch responsive to activation of said input for connecting said resistor to said further node, said substrate well connected to said resistor.

9. The apparatus of claim 8, wherein said first-mentioned voltage is approximately −0.5 volts and said further voltage is approximately 0 volts.

10. The apparatus of claim 1, including a plurality of said storage cells having said substrate wells thereof connected together and also connected to said voltage adjuster.

11. An apparatus for controlling access to a data storage element in a memory device comprising:

a transistor for accessing said data storage element, said transistor including a substrate well;

a circuit coupled to said substrate well for adjusting a voltage on said substrate well; and a word line driver final stage coupled to said transistor via an input for accessing said storage element;

wherein said circuit is coupled to said input and is responsive to activation of said input by said word line driver final stage for adjusting the voltage on said substrate well.

12. The apparatus of claim 11, wherein said circuit includes a switch coupled to said input and said substrate well, said switch responsive to activation of said input for initiating adjustment of the voltage on said substrate well.

13. The apparatus of claim 12, wherein said circuit includes a node at a predetermined voltage coupled to said switch.

14. The apparatus of claim 11, wherein said circuit includes a further node at a further predetermined voltage coupled to said switch.

15. The apparatus of claim 14, wherein said circuit includes a resistor connected in series between said first-mentioned node and said switch, said switch responsive to activation of said input for connecting said resistor to said further node, said substrate well connected to said resistor.

16. The apparatus of claim 11, wherein said data storage element includes a capacitor.

17. A DRAM apparatus, comprising:

a storage cell including a transistor having a substrate well;

a voltage adjuster coupled to said substrate well for adjusting a voltage on said substrate well; and an input coupled to said storage cell for accessing said storage cell, wherein said voltage adjuster includes a switch coupled to said input and said substrate well, said switch responsive to activation of said input for initiating adjustment of the voltage on said substrate well, wherein said voltage adjuster includes a node at a predetermined voltage coupled to said switch, and wherein said voltage adjuster includes a resistor connected in series between said switch and said node.

18. The apparatus of claim 17, wherein said switch includes a transistor, said transistor having a gate coupled to said input, a drain coupled to said resistor and said substrate well, and a source coupled to a voltage source.

19. A DRAM apparatus, comprising:

a storage cell including a transistor having a substrate well;

a voltage adjuster coupled to said substrate well for adjusting a voltage on said substrate well; and an input coupled to said storage cell for accessing said storage cell, wherein said voltage adjuster includes a switch coupled to said input and said substrate well, said switch responsive to activation of said input for initiating adjustment of the voltage on said substrate well, wherein said voltage adjuster includes a node at a predetermined voltage coupled to said switch, wherein said voltage adjuster includes a further node at a further predetermined voltage coupled to said switch, and wherein said voltage adjuster includes a resistor connected in series between said first-mentioned node and said switch, said switch responsive to activation of said input for connecting said resistor to said further node, said substrate well connected to said resistor.

20. The apparatus of claim 19, wherein said first-mentioned voltage is approximately −0.5 volts and said further voltage is approximately 0 volts.

21. An apparatus for controlling access to a data storage element in a memory device, comprising:

a transistor for accessing said data storage element, said transistor including a substrate well;

a circuit coupled to said substrate well for adjusting a voltage on said substrate well; and an input coupled to said transistor for controlling access to said data storage element;

wherein said circuit includes a switch coupled to said input and said substrate well, said switch responsive to activation of said input for initiating adjustment of the voltage on said substrate well, wherein said circuit includes a node at a predetermined voltage coupled to said switch, wherein said circuit includes a further node at a further predetermined voltage coupled to said switch, wherein said circuit includes a resistor connected in series between said first-mentioned node and said switch, said switch responsive to activation of said input for connecting said resistor to said further node, said substrate well connected to said resistor.

* * * * *